(12) United States Patent
Waite

(10) Patent No.: US 10,896,855 B2
(45) Date of Patent: Jan. 19, 2021

(54) ASYMMETRIC GATE SPACER FORMATION USING MULTIPLE ION IMPLANTS

(71) Applicant: APPLIED Materials, Inc., Santa Clara, CA (US)

(72) Inventor: Andrew M. Waite, Beverly, MA (US)

(73) Assignee: APPLIED Materials, Inc., Santa Clara, CA (US)

( * ) Notice: Subject to any disclaimer, the term of this patent is extended or adjusted under 35 U.S.C. 154(b) by 21 days.

(21) Appl. No.: 16/436,296

(22) Filed: Jun. 10, 2019

(65) Prior Publication Data

US 2020/0388541 A1   Dec. 10, 2020

(51) Int. Cl.
*H01L 21/336* (2006.01)
*H01L 21/8234* (2006.01)
*H01L 21/321* (2006.01)

(52) U.S. Cl.
CPC .... *H01L 21/823468* (2013.01); *H01L 21/321* (2013.01)

(58) Field of Classification Search
CPC ......... H01L 21/26586; H01L 29/66659; H01L 21/31155; H01L 29/7835; H01L 29/6653
See application file for complete search history.

(56) References Cited

U.S. PATENT DOCUMENTS

| | | | | |
|---|---|---|---|---|
| 2004/0087094 A1* | 5/2004 | Wristers | ............ | H01L 21/26586 438/302 |
| 2006/0194381 A1* | 8/2006 | Wei | ................... | H01L 21/26586 438/197 |
| 2010/0025744 A1* | 2/2010 | Miyashita | ......... | H01L 21/26506 257/288 |
| 2010/0041186 A1* | 2/2010 | Surdeanu | .......... | H01L 29/66356 438/151 |
| 2010/0081244 A1* | 4/2010 | Papageorgiou | ..... | H01L 29/7834 438/286 |
| 2011/0049582 A1* | 3/2011 | Johnson | .............. | H01L 29/6653 257/288 |
| 2014/0170827 A1* | 6/2014 | Zhang | ................ | H01L 29/66356 438/305 |
| 2016/0194758 A1* | 7/2016 | Nemani | ................ | C23C 16/045 427/527 |
| 2018/0130668 A1* | 5/2018 | Liu | .................... | H01L 21/26506 |
| 2018/0219009 A1* | 8/2018 | Liu | ..................... | H01L 27/0886 |
| 2020/0066521 A1* | 2/2020 | Lin | .................... | H01L 21/31144 |

* cited by examiner

*Primary Examiner* — Bradley Smith
*Assistant Examiner* — David J Goodwin
(74) *Attorney, Agent, or Firm* — Kacvinsky Daisak Bluni PLLC

(57) ABSTRACT

Disclosed are methods for forming a semiconductor device. In some embodiments, a method may include providing a gate structure atop a substrate, providing a gate spacer along a sidewall of the gate structure, and performing a first ion implant to the gate structure and the gate spacer, the first ion implant comprising a thermal implant disposed at a first non-zero angle of inclination with respect to a perpendicular to a plane of the substrate. The method may further include performing a second ion implant to the gate structure and the gate spacer, the second ion implant including a room-temperature ion implant disposed at a second non-zero angle of inclination with respect to the perpendicular to the plane of the substrate, and etching the gate structure and the gate spacer to remove just the second section of the gate spacer.

15 Claims, 5 Drawing Sheets

ASYMMETRIC GATE SPACER FORMATION USING MULTIPLE ION IMPLANTS

FIELD OF THE DISCLOSURE

The present disclosure relates to semiconductor devices, and more particularly, to asymmetric gate spacer formation using multiple ion implants.

BACKGROUND OF THE DISCLOSURE

There is a trade-off between source/drain series resistance and gate to source/drain capacitance in the design of symmetric planar metal oxide semiconductor field-effect transistors (MOSFETs). Specifically, FET saturated currents are more sensitive to source resistance and less sensitive to drain resistance. FET drive current improves more with reduced source resistance than with reduced drain resistance. Additionally, circuit delay is more sensitive to gate to drain capacitance than gate to source capacitance. That is, due to the Miller effect, the gate to drain capacitance can impact circuit delay significantly more than gate to source capacitance. However, some techniques associated with reducing source/drain resistance to improve drive current often simultaneously increase the gate to drain capacitance, thereby increasing circuit delay. Similarly, some techniques associated with reducing gate to source/drain capacitance often simultaneously increase source resistance, thereby degrading drive current. Thus, there is often an intrinsic trade-off between decreasing source resistance to improve drive current and decreasing gate to drain capacitance to minimize circuit delay.

Asymmetric transistors are attractive for some applications. An asymmetric MOSFET, for example, may have asymmetric source/drain regions to address problems relating to the Miller effect. Source/drain regions that have different heights and/or widths or be different distances from the gate electrode are among the elements that may be found in an asymmetric MOSFET.

SUMMARY OF THE DISCLOSURE

In view of the foregoing, what is needed are approaches for asymmetric gate spacer formation using a multi-implant process. In some approaches, a method may include providing a gate structure atop a substrate, providing a gate spacer along a sidewall of the gate structure, and performing a first ion implant to the gate structure and the gate spacer, the first ion implant comprising a thermal implant disposed at a first non-zero angle of inclination with respect to a perpendicular to a plane of the substrate. The method may further include performing a second ion implant to the gate structure and the gate spacer, the second ion implant comprising a room-temperature ion implant disposed at a second non-zero angle of inclination with respect to the perpendicular to the plane of the substrate, and etching the gate structure and the gate spacer to remove just the second section of the gate spacer.

In some approaches, a method of forming an asymmetric gate spacer may include providing a gate structure atop a substrate, providing a first gate spacer along a first sidewall of the gate structure, and providing a second gate spacer along a second sidewall of the gate structure, and performing a first ion implant to the first gate spacer, the first ion implant comprising a high-temperature implant disposed at a first non-zero angle of inclination with respect to a perpendicular to a plane of the substrate. The method may further include performing a second ion implant to the second gate spacer, the second ion implant comprising a room-temperature ion implant disposed at a second non-zero angle of inclination with respect to the perpendicular to the plane of the substrate, and etching the gate structure, the first gate spacer, and the second gate spacer, wherein just the second gate spacer is removed from the second sidewall of the gate structure.

In some approaches, a method of forming an asymmetric gate spacer may include providing a dummy gate structure atop a substrate, providing a first gate spacer along a first sidewall of the dummy gate structure, and providing a second gate spacer along a second sidewall of the dummy gate structure, and performing a first ion implant to the first gate spacer, the first ion implant comprising a high-temperature implant disposed at a first non-zero angle of inclination with respect to a perpendicular to a plane of the substrate. The method may further include performing a second ion implant to the second gate spacer, the second ion implant comprising a room-temperature ion implant disposed at a second non-zero angle of inclination with respect to the perpendicular to the plane of the substrate, and etching the dummy gate structure, the first gate spacer, and the second gate spacer, wherein just the second gate spacer is removed from the second sidewall of the dummy gate structure.

BRIEF DESCRIPTION OF THE DRAWINGS

The accompanying drawings illustrate example approaches of the disclosure, including the practical application of the principles thereof, as follows.

Figure 1:
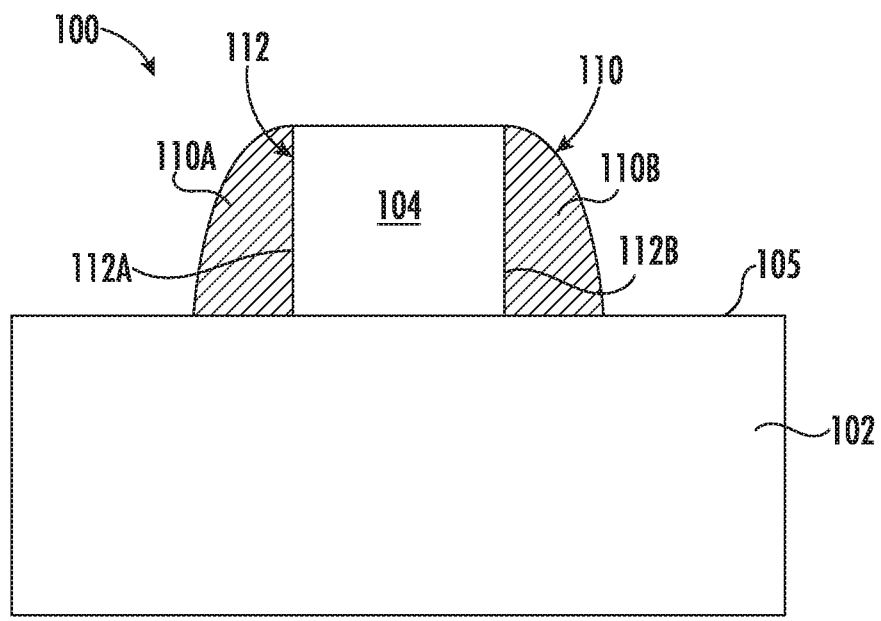
FIG. 1 depicts a side cross-sectional view of a semiconductor device in accordance with embodiments of the present disclosure.

The drawings are not necessarily to scale. The drawings are merely representations, not intended to portray specific parameters of the disclosure. The drawings are intended to depict exemplary embodiments of the disclosure, and therefore are not be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines otherwise visible in a "true" cross-sectional view, for illustrative clarity. Furthermore, for clarity, some reference numbers may be omitted in certain drawings.

DETAILED DESCRIPTION

Methods and devices in accordance with the present disclosure will now be described more fully hereinafter with reference to the accompanying drawings, where embodiments of the methods are shown. The methods and devices may be embodied in many different forms and are not to be construed as being limited to the embodiments set forth herein. Instead, these embodiments are provided so the disclosure will be thorough and complete, and will fully convey the scope of the system and method to those skilled in the art.

Described herein are methods to selectively remove a sidewall spacer from only one side of a gate structure, such as a mandrel or dummy gate electrode. For example, the gate structure may contain a sidewall spacer formed from a silicon nitride film. As deposited, the silicon nitride flim may have moderately high etch rate, for example, in 2% dilute hydrofluoric (DFH) acid solution at approximately 50 A/minute. The etch rate can be increased by implanting the silicon nitride with a room-temperature argon or helium implant, and reduced by implanting argon or helium at a high temperature, e.g., above 500° C. By combining the high-temperature implant with the room-temperature ion implant, the sidewall spacer along just a portion of the dummy gate electrode or mandrel may be removed following the DFH etch.

Turning now to FIG. 1, there is shown a cross-sectional view of a semiconductor device (hereinafter "device") 100 according to embodiments of the disclosure. The device 100 may include a substrate 102, and a gate structure 104 formed atop or extending from a surface 105 of the substrate 102. In some non-limiting embodiments, the gate structure 104 is a dummy gate or a mandrel, wherein a material of the gate structure 104 may be polysilicon. A spacer 110 may be formed along a sidewall 112 of the gate structure 104. The spacer 110 may be single component, for example, in the case the gate structure 104 is a mandrel. The spacer 110 may alternatively include multiple components. For example, the spacer 110 may include a first spacer 110A formed along a first sidewall 112A of the gate structure 104, and a second spacer 110B formed along a second sidewall 112B of the gate structure 104. In some non-limiting embodiments, the spacer 110 may be a conformal layer of silicon nitride (SiN), siliconboron carbonitride ceramic (SiBCN), or silicon oxycarbonitride (SiOCN). Although shown only along the sidewall 112 of the gate structure 104, it will be appreciated the spacer 110 may also extend atop the gate structure 104.

In some embodiments, the gate structure 104 is made from polysilicon. In some embodiments, the gate structure 104 may include silicon dioxide or metal and high-k dielectric materials. Suitable high-k dielectric materials include comprises silicon dioxide ($SiO_2$), silicon oxynitride (SiON), hafnium dioxide ($HfO_2$), zirconium dioxide ($ZrO_2$), combinations thereof or other suitable materials. In some embodiments, the gate structure 104 may include multiple layers.

The term "substrate" as used herein is intended to include a semiconductor substrate, a semiconductor epitaxial layer deposited or otherwise formed on a semiconductor substrate and/or any other type of semiconductor body, and all such structures are contemplated as falling within the scope of the present embodiments. For example, the semiconductor substrate may comprise a semiconductor wafer (e.g., silicon, SiGe, or an SOI wafer) or one or more die on a wafer, and any epitaxial layers or other type semiconductor layers formed there over or associated therewith. A portion or entire semiconductor substrate may be amorphous, polycrystalline, or single-crystalline. In addition to the aforementioned types of substrates, the semiconductor substrate may also comprise a hybrid oriented (HOT) semiconductor substrate having surface regions of different crystallographic orientation. The semiconductor substrate may be doped, undoped, or contain doped regions and undoped regions therein. The semiconductor substrate may contain regions with strain and regions without strain therein, or contain regions of tensile strain and compressive strain.

Figure 2:
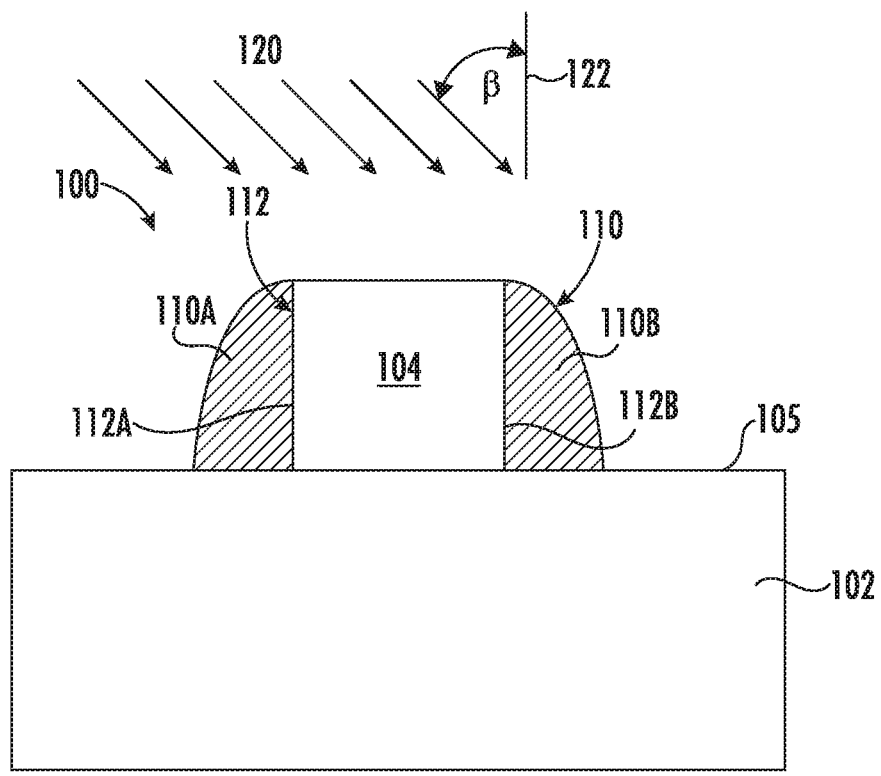
FIG. 2 depicts a side cross-sectional view of the semiconductor device of FIG. 1 receiving a first ion implant in accordance with embodiments of the present disclosure.

As shown in FIG. 2, a first ion implant 120 may be performed on the device 100. In exemplary embodiments, the first ion implant 120 is disposed at a first non-zero angle of inclination β with respect to a perpendicular 122 to a plane defined by the surface 105 of the substrate 102. Although non-limiting, the first ion implant 120 may include argon or helium ions. In some embodiments, the first ion implant 120 may generally impact the first spacer 110A more than the second spacer 110B due to the first non-zero angle of inclination β. In other embodiments, the non-zero angle of inclination β is selected to ensure just the first spacer 110A is impacted by the first ion implant 120. Embodiments herein are not limited in this context, however.

The first ion implant 120 may be a high-temperature ion implant. For example, the first ion implant 120 may be performed at temperatures between approximately 150° C. and 550° C. In some embodiments, the first ion implant 120 may be performed using a Thermion tool at platen temperatures greater than 500° C. As a result, the first spacer 110A, which is treated with the high-temperature Thermion implant, will etch in a DHF solution at a much lower rate than those portions of the spacer 110 not impacted by the first ion implant 120.

Although non-limiting, the first ion implant 120 may be performed over two or more etch processes. For example, during operation, the first ion implant 120 may be performed while the device 100 is in a first position. Following implantation of the device in one position, the device 100 may be rotated (e.g., by 15, 30, 45, 60, 90, 120, 180 degrees, etc.), and another ion implant may be applied to the device 100 in the second position. In other embodiments, the device 100 may be stationary, while an etch tool (not shown) is rotated/moved relative to the device 100.

Figure 3:
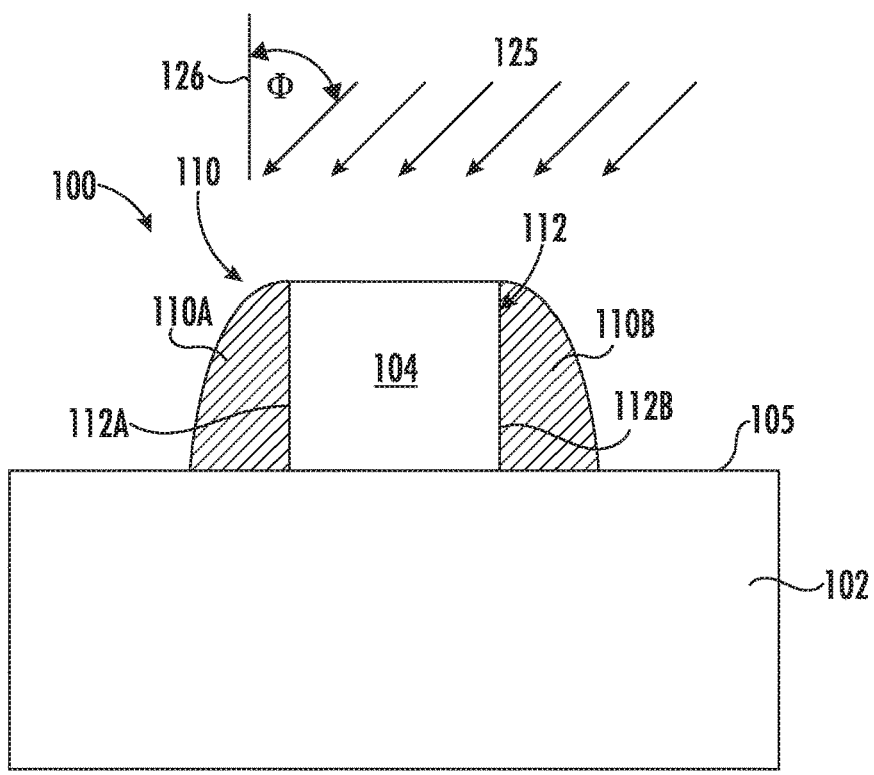
FIG. 3 depicts a side cross-sectional view of the semiconductor device of FIG. 1 receiving a second ion implant in accordance with embodiments of the present disclosure.

As shown in FIG. 3, a second ion implant 125 may be performed to the device 100. In exemplary embodiments, the second ion implant 125 is disposed at a second non-zero angle of inclination φ with respect to a perpendicular 126 to the plane defined by the surface 105 of the substrate 102. Although non-limiting, the second ion implant 125 may include argon or helium ions. In some embodiments, the second ion implant 125 may generally impact the second spacer 110B more than the first spacer 110A due to the second non-zero angle of inclination φ. In other embodiments, the second non-zero angle of inclination φ is selected to ensure just the second spacer 110B is impacted by the second ion implant 125. In some embodiments, the first non-zero angle of inclination β measured from the perpendicular 122 (FIG. 2) is approximately equal to the second non-zero angle of inclination φ measured from the perpendicular 126. In other embodiments, the first and second non-zero angles of inclination β, φ are different.

The second ion implant 125 may be a room-temperature ion implant. For example, the second ion implant 125 may be performed at a temperature between approximately 15 and 30° C. When argon is used with the second ion implant 125, the wet etch rate of the SiN of the spacer 110 may increase up to 6× the unimplanted etch rate for a concentration of 6 $E21/cm^2$, for example.

Although non-limiting, the second ion implant 125 may be performed over two or more etch processes. For example, during operation, the second ion implant 125 may be performed while the device 100 is in a first position. Following implantation of the device in one position, the device 100 may be rotated (e.g., by 15, 30, 45, 60 degrees, etc.), and another ion implant may be applied to the device 100. In other embodiments, the device 100 may be stationary, while an etch tool (not shown) is rotated/moved relative to the device 100. In some embodiments, the device 100 may be rotated 180° between the first ion implant 122 and the second ion implant 125.

Figure 4:
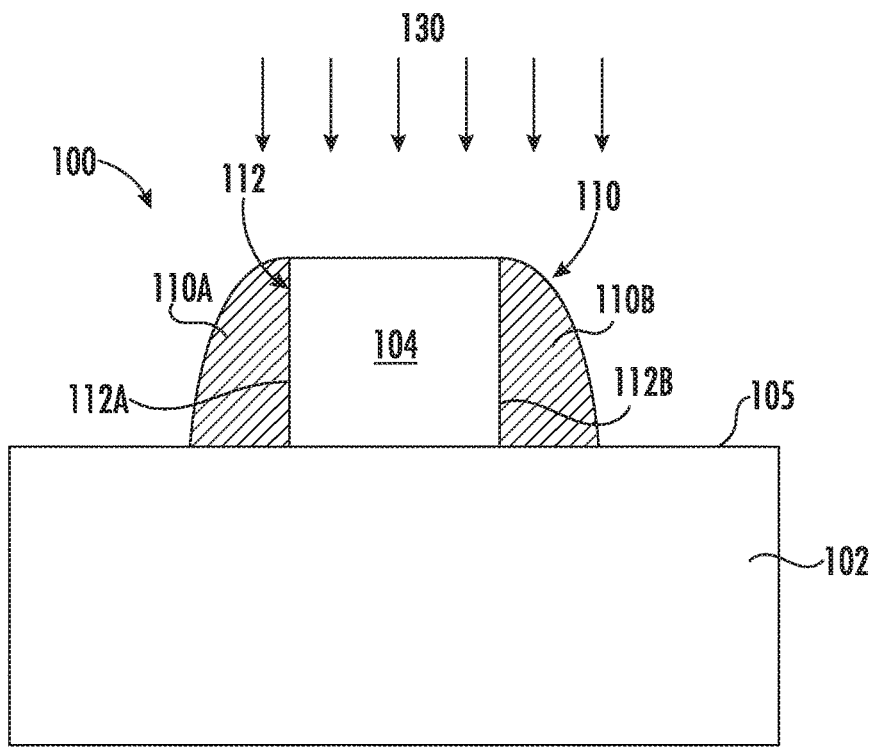
FIG. 4 depicts a side cross-sectional view of the semiconductor device of FIG. 1 receiving an etch treatment in accordance with embodiments of the present disclosure.
Figure 5:
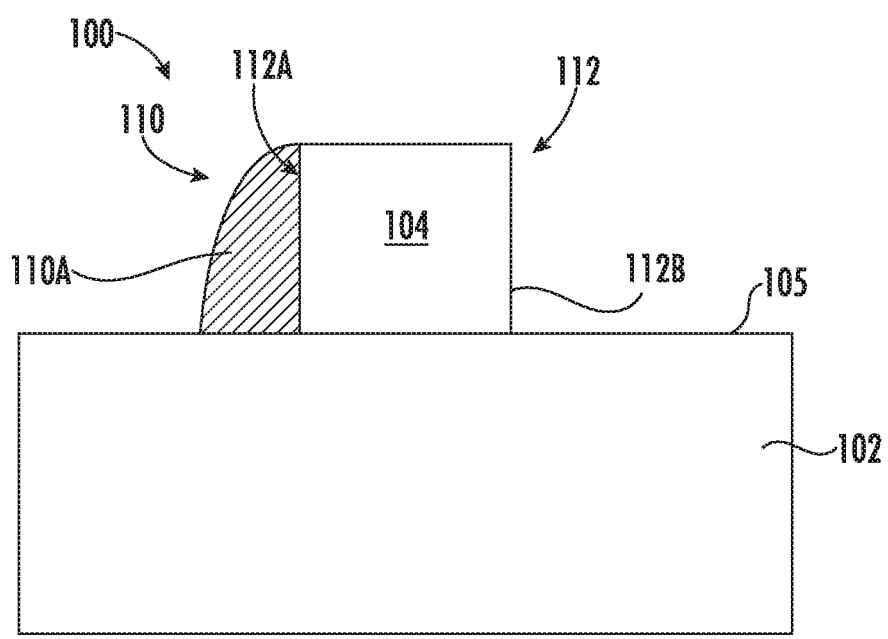
FIG. 5 depicts a side cross-sectional view of the semiconductor device of FIG. 1 having an asymmetric spacer in accordance with embodiments of the present disclosure.

Next, the device 100 may be etched 130 as shown in FIG. 4, resulting in the second spacer 110B being removed from just the second sidewall 112B of the gate structure 104, as demonstrated in FIG. 5. In some embodiments, the device 100 is etched using a DHF acid solution. The portion of the spacer 110 treated with the first ion implant 120 etches in the DHF acid solution at a much lower rate than untreated portions of the spacer 110, while the portion of the spacer 110 implanted with the second implant will etch at a relatively higher rate. The DHF solution can therefore be used to remove the second spacer 110B whist leaving the high-temperature treated first spacer 110A spacer mostly intact. As shown, the second spacer 110B may be etched selective to the surface 105 of the substrate 102. In other words, an entire height of second sidewall 112B may be exposed following the etch 130.

Figure 6:
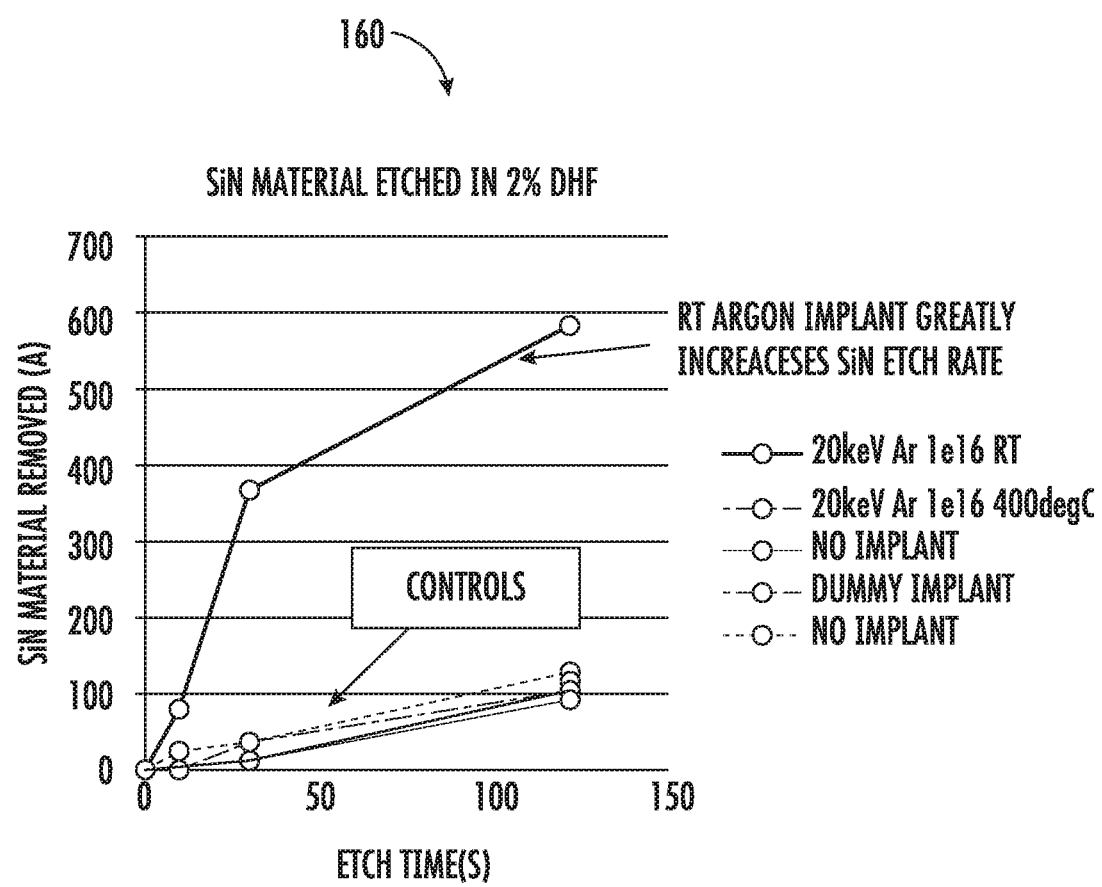
FIGS. 6-7 demonstrate differential etch rates of various ion implants in accordance with embodiments of the present disclosure.
Figure 7:
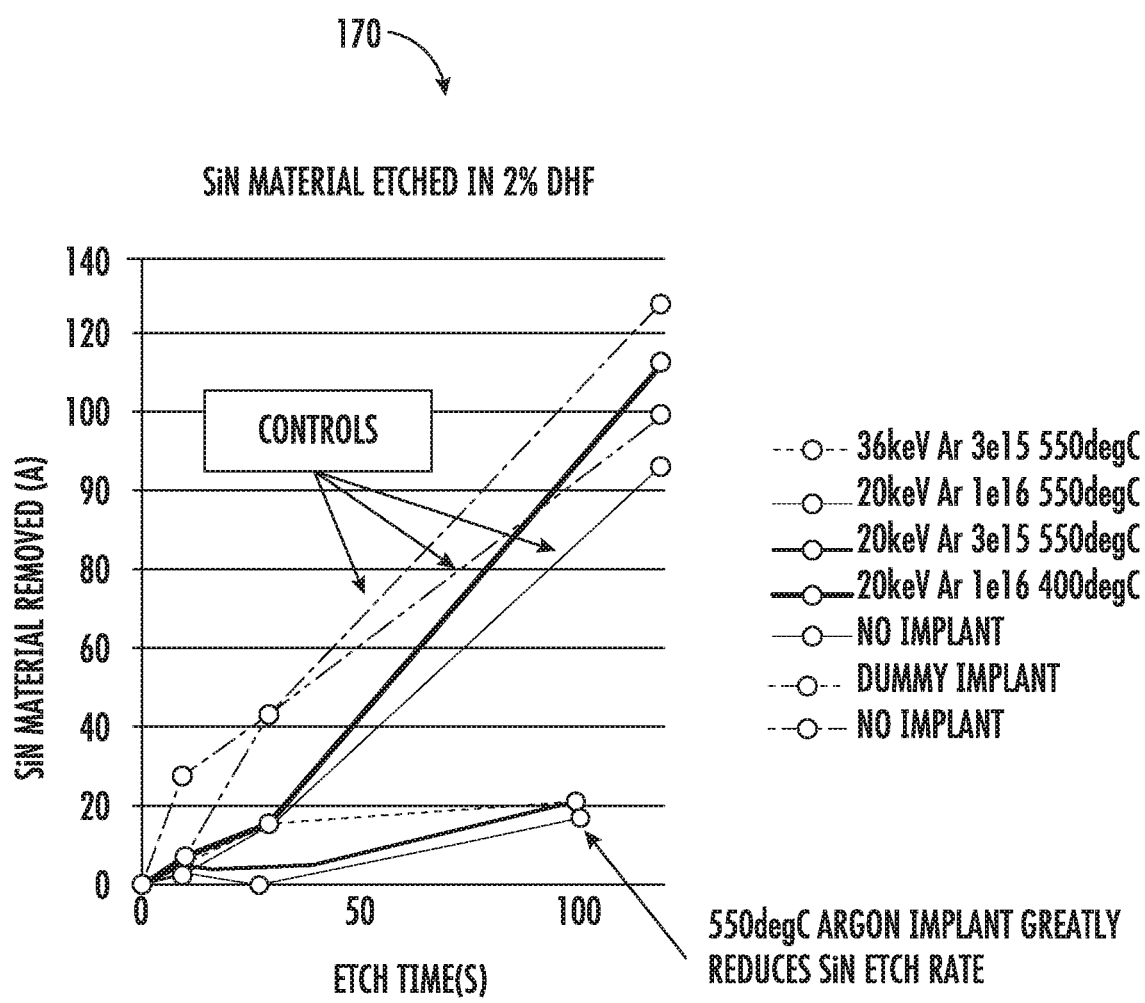

FIGS. 6-7 demonstrate differential etch rates of ion implants upon silicon nitride, such as the silicon nitride of the spacer 110 described herein. In the non-limiting examples shown, silicon nitride material removal rates for a 100:1 DHF etch are plotted. As shown in the graph 160 of FIG. 6, a room-temperature (e.g., approximately 20° C.) argon implant greatly increases SiN etch rates. As shown in the graph 170 of FIG. 7, a 550° C. argon implant greatly reduces SiN etch rates. It is therefore demonstrated that silicon nitride spacer rates are strongly temperature dependent.

For the sake of convenience and clarity, terms such as "top," "bottom," "upper," "lower," "vertical," "horizontal," "lateral," and "longitudinal" will be used herein to describe the relative placement and orientation of components and their constituent parts as appearing in the figures. The terminology will include the words specifically mentioned, derivatives thereof, and words of similar import.

As used herein, an element or operation recited in the singular and proceeded with the word "a" or "an" is to be understood as including plural elements or operations, until such exclusion is explicitly recited. Furthermore, references to "one embodiment" of the present disclosure are not intended as limiting. Additional embodiments may also incorporating the recited features.

Furthermore, the terms "substantial" or "substantially," as well as the terms "approximate" or "approximately," can be used interchangeably in some embodiments, and can be described using any relative measures acceptable by one of ordinary skill in the art. For example, these terms can serve as a comparison to a reference parameter, to indicate a deviation capable of providing the intended function. Although non-limiting, the deviation from the reference parameter can be, for example, in an amount of less than 1%, less than 3%, less than 5%, less than 10%, less than 15%, less than 20%, and so on.

Still furthermore, one of ordinary skill will understand when an element such as a layer, region, or substrate is referred to as being formed on, deposited on, or disposed "on," "over" or "atop" another element, the element can be directly on the other element or intervening elements may also be present. In contrast, when an element is referred to as being "directly on," "directly over" or "directly atop" another element, no intervening elements are present.

As used herein, "depositing" and/or "deposited" may include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RT-CVD), ultra-high vacuum CVD (UHVCVD), limited reaction processing CVD (LRPCVD), metal-organic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

In various embodiments, design tools can be provided and configured to create the datasets used to pattern the semiconductor layers of the device, e.g., as described herein. For example, data sets can be created to generate photomasks used during lithography operations to pattern the layers for structures as described herein. Such design tools can include a collection of one or more modules and can also be comprised of hardware, software or a combination thereof. Thus, for example, a tool can be a collection of one or more software modules, hardware modules, software/hardware modules or any combination or permutation thereof. As another example, a tool can be a computing device or other appliance running software, or implemented in hardware.

As used herein, a module might be implemented utilizing any form of hardware, software, or a combination thereof. For example, one or more processors, controllers, ASICs, PLAs, logical components, software routines or other mechanisms might be implemented to make up a module. In implementation, the various modules described herein might be implemented as discrete modules or the functions and features described can be shared in part or in total among one or more modules. In other words, as would be apparent to one of ordinary skill in the art after reading this description, the various features and functionality described herein may be implemented in any given application and can be implemented in one or more separate or shared modules in various combinations and permutations. Although various features or elements of functionality may be individually described or claimed as separate modules, one of ordinary skill in the art will understand these features and functionality can be shared among one or more common software and hardware elements.

In view of the foregoing, at least the following advantages are achieved by the embodiments disclosed herein. A first advantage includes selectively removing a portion of the sidewall spacer, while leaving another portion of the sidewall spacer intact. A second advantage is an increased design flexibility afforded by the selective sidewall removal.

While certain embodiments of the disclosure have been described herein, the disclosure is not limited thereto, as the disclosure is as broad in scope as the art will allow and the specification may be read likewise. Therefore, the above description is not to be construed as limiting. Instead, the above description is merely as exemplifications of particular embodiments. Those skilled in the art will envision other modifications within the scope and spirit of the claims appended hereto.

What is claimed is:

1. A method of forming a semiconductor device, comprising:

providing a gate structure atop a substrate;

providing a gate spacer along a sidewall of the gate structure;

performing a first ion implant to the gate structure and the gate spacer, the first ion implant disposed at a first non-zero angle of inclination with respect to a perpendicular to a plane of the substrate;

performing a second ion implant to the gate structure and the gate spacer, the second ion implant disposed at a second non-zero angle of inclination with respect to the perpendicular to the plane of the substrate, wherein the first ion implant is performed at a temperature greater than 500° C. and the second ion implant is performed at a temperature between approximately 15° C. and 30° C.; and etching the gate spacer to remove just one section of the gate spacer selective to a top surface of the substrate and to a sidewall surface of the gate structure.

2. The method of claim 1, further comprising etching the gate spacer using a dilute hydrofluoric acid solution.

3. The method according to claim 1, wherein the gate structure is a dummy gate electrode, and wherein the gate spacer is a silicon nitride spacer.

4. The method according to claim 1, further comprising rotating the substrate 180° between the first ion implant and the second ion implant.

5. The method according to claim 1, wherein the first ion implant includes at least one of: argon ions and helium ions.

6. The method according to claim 1, wherein the first ion implant and the second ion implant include argon ions.

7. A method of forming an asymmetric gate spacer, the method comprising:

providing a gate structure atop a substrate;

providing a first gate spacer along a first sidewall of the gate structure, and providing a second gate spacer along a second sidewall of the gate structure;

performing a first ion implant to the first gate spacer, the first ion implant disposed at a first non-zero angle of inclination with respect to a perpendicular to a plane of the substrate, wherein the first ion implant is performed at a temperature greater than 500° C.;

performing a second ion implant to the second gate spacer, the second ion implant disposed at a second non-zero angle of inclination with respect to the perpendicular to the plane of the substrate, wherein the second ion implant is performed at a temperature between approximately 15° C. and 30° C.; and etching the first gate spacer and the second gate spacer, wherein just the second gate spacer is removed selective to a top surface of the substrate and to a sidewall surface of the second sidewall of the gate structure.

8. The method of claim 7, further comprising etching the first gate spacer and the second gate spacer using a dilute hydrofluoric acid solution.

9. The method according to claim 7, wherein the gate structure is a dummy gate electrode, and wherein the first and second gate spacers are silicon nitride spacers.

10. The method according to claim 7, wherein the first and second ion implants include at least one of: argon ion and helium ions.

11. A method of forming an asymmetric gate spacer, the method comprising:

providing a dummy gate structure atop a substrate;

providing a first gate spacer along a first sidewall of the dummy gate structure, and providing a second gate spacer along a second sidewall of the dummy gate structure; performing a first ion implant to the first gate spacer, the first ion implant disposed at a first non-zero angle of inclination with respect to a perpendicular to a plane of the substrate, wherein the first ion implant is performed at a platen temperature greater than 500° C.;

performing a second ion implant to the second gate spacer, the second ion implant disposed at a second non-zero angle of inclination with respect to the perpendicular to the plane of the substrate, wherein the second ion implant is performed at a temperature between approximately 15° C. and 30° C.; and etching the first gate spacer and the second gate spacer, wherein just the second gate spacer is removed selective to a top surface of the substrate and to a sidewall surface of the second sidewall of the dummy gate structure.

12. The method according to claim 11, further comprising etching the first gate spacer and the second gate spacer using a dilute hydrofluoric acid solution.

13. The method according to claim 11, wherein the first and second gate spacers are silicon nitride spacers.

14. The method according to claim 11, wherein the first and second ion implants include at least one of: argon ions and helium ions.

15. The method according to claim 11, further comprising rotating the substrate approximately 180° between the first ion implant and the second ion implant.

* * * * *